United States Patent
Okazaki et al.

(10) Patent No.: US 6,514,642 B2
(45) Date of Patent: Feb. 4, 2003

(54) PHASE SHIFT MASK AND METHOD OF MANUFACTURE

(75) Inventors: Satoshi Okazaki, Nakakubiki-gun (JP); Tamotsu Maruyama, Nakakubiki-gun (JP); Yukio Inazuki, Nakakubiki-gun (JP); Hideo Kaneko, Nakakubiki-gun (JP); Shinichi Kohno, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 8 days.

(21) Appl. No.: 09/790,886

(22) Filed: Feb. 23, 2001

(65) Prior Publication Data

US 2001/0028982 A1 Oct. 11, 2001

(30) Foreign Application Priority Data

Feb. 24, 2000 (JP) ........................................ 2000-047373

(51) Int. Cl.[7] .................................................. G03F 9/00
(52) U.S. Cl. ........................................................ 430/5
(58) Field of Search ............................ 430/5, 322, 324; 204/192.12, 192.23, 192.11

(56) References Cited

U.S. PATENT DOCUMENTS

| | | | |
|---|---|---|---|
| 5,691,090 A | * 11/1997 | Isao et al. | 430/5 |
| 5,700,605 A | * 12/1997 | Ito et al. | 430/5 |
| 5,750,290 A | * 5/1998 | Yasuzato et al. | 430/5 |

* cited by examiner

Primary Examiner—S. Rosasco
(74) Attorney, Agent, or Firm—Millen, White, Zelano & Branigan, P.C.

(57) ABSTRACT

In a phase shift mask comprising an exposure light-transmitting substrate and a second light-transmitting region thereon, the second light-transmitting region functions as a phase shifter and is made of a fluorine-doped molybdenum silicide film or fluorine-doped chromium silicide film formed by a sputtering technique that uses molybdenum metal, chromium metal, molybdenum silicide or chromium silicide as the target and $SiF_2$ as the reactive gas. The phase shifter has a high refractive index to short-wavelength exposure light, enabling a 180-degree phase change to be achieved at a minimum film thickness, and also has a good stability to such light. The phase shift mask can be used to fabricate semiconductor integrated circuits to a smaller minimum feature size and a higher level of integration.

20 Claims, 4 Drawing Sheets

PHASE

LIGHT
INTENSITY

180° PHASE
CHANGE

PHASE SHIFT MASK AND METHOD OF MANUFACTURE

BACKGROUND OF THE INVENTION

1. Field of the Invention

The present invention relates to a phase shift mask and a method of manufacturing the phase shift mask. More particularly, the invention relates both to a novel phase shift mask having sufficient transmittance as well as durability, and thus stability over time, to irradiation by short-wavelength, high-energy light such as ArF excimer laser light and $F_2$ laser light, and also to a method for manufacturing such phase shift masks.

2. Prior Art

The shifter material used in halftone phase shift masks is often composed primarily of molybdenum silicide, although chromium oxide-based materials are also used.

As shown in FIG. 5, which is incorporated in and constitutes part of the specification, a halftone phase shift mask is comprised of a quartz substrate 32 on which there is provided a shifter 34 which changes the phase of the light. The mask improves resolution by utilizing an interference effect between light that passes through the shifter 34 and undergoes a change of phase, and light that does not pass through the shifter 34 and does not undergo a change of phase.

The trends toward higher processing speeds and a higher level of integration in large-scale integration (LSI) chips have created a need for a smaller pattern rule in semiconductor devices. The photomasks used to form those finer patterns must likewise be produced to a smaller feature size.

Efforts are being made to develop phase shift masks which meet these criteria. However, further reduction in the minimum feature size on the masks will require lowering the wavelength of exposure light emitted by the light source used during mask fabrication from the i-line wavelength (365 nm) to that of KrF excimer laser light (248 nm), ArF excimer laser light (193 nm), and eventually $F_2$ laser light (157 nm).

This is because, in lithography, the resolution is proportional to the wavelength of the exposure light, as indicated by the Rayleigh formula:

$$R = k\lambda/NA.$$

In the formula, R is the resolution, k is the process coefficient, $\lambda$ is the wavelength, and NA is the numerical aperture of the lens.

However, the molybdenum silicide-based shifter films which are most commonly used today have such a large absorption coefficient that very little, if any, short-wavelength light in the ArF excimer laser light (193 nm) and $F_2$ laser light (157 nm) regions passes through. Hence, these films are unsuitable for use together with such shorter wavelength exposure light sources.

In the case of chromium-based shifter films, those composed solely of chromium metal have very little transmittance for the simple fact that they are metal. Even if the chromium metal has oxygen, nitrogen or carbon added to it, a transmittance sufficient for use as a phase shifter material in a short-wavelength region of 193 nm or less, such as a transmittance of 3 to 40%, has been difficult to achieve.

Moreover, because short-wavelength light of 193 nm or less has a much higher energy than 365 nm or 248 nm light, like the mask substrate and the lens optics, the phase shifter material is subject to deterioration over time. A need is thus felt for the development of a material capable of enduring high-energy irradiation.

At the same time, the phase shifter material must be capable of effecting a 180 degree shift in the phase of light that passes through the shifter layer relative to light that does not pass through. Bearing in mind the topography of the shifter layer pattern, by forming the shifter film to a thickness D, defined as $$D = \lambda/2(n-1) \tag{1},$$

from a material having a high refractive index, a 180-degree phase shift can be achieved at a small film thickness, or step, on the substrate. In the above formula, D is the shifter film thickness for generating a 180-degree phase shift, n is the refractive index of the shifter material, and $\lambda$ is the wavelength of the transmitted light.

However, prior-art chromium-based and molybdenum silicide-based shifter materials cannot provide a high refractive index at shorter exposure light wavelengths (i.e., wavelengths of 193 nm or less). Hence, they must have a large film thickness, and achieve a phase shift of 180 degrees only with difficulty.

SUMMARY OF THE INVENTION

It is therefore an object of the present invention to provide phase shift masks which resolve the above drawbacks of prior-art halftone phase shift masks and make it possible to fabricate semiconductor integrated circuits having a smaller minimum feature size and a higher degree of integration. Another object of the invention is to provide a method of manufacturing such phase shift masks.

An additional object of the invention is to provide a phase shifter material which has good durability to small-wavelength, high-energy irradiation such as ArF excimer laser light and $F_2$ laser light, and thus undergoes little deterioration over time A further object of the invention is to provide phase shift masks which, by employing a shifter material endowed with a relatively high refractive index to short-wavelength exposure light having a wavelength of 193 nm or less and minimizing the topography of the master pattern surface at which the exposure beam is focused, are capable of a 180-degree change of phase, and can improve the profile shape at the time of exposure. A still further object of the invention is to provide a method of manufacturing such phase shift masks.

The inventor has found that by using molybdenum metal or molybdenum silicide as the target and $SiF_2$ as the reactive gas, or by using chromium metal or chromium silicide as the target and $SiF_2$ as the reactive gas, it is possible to form a high-performance fluorine-doped molybdenum silicide film or fluorine-doped chromium silicide film which shifts the phase of exposure light passing through it by 180±5 degrees and has a transmittance to short wavelengths of 193 nm or less of 3 to 40%, properties that cannot both be achieved with the chromium-based and molybdenum silicide-based shifter materials used to date. This discovery has made it possible to effectively resolve the problems inherent in prior-art halftone phase shift masks, enabling phase shift masks to be provided which are capable of further reducing the minimum feature size and increasing the level of integration in semiconductor integrated circuits.

Accordingly, in a first aspect, the invention provides a phase shift mask comprising an exposure light-transmitting substrate and a second light-transmitting region on the substrate, which second light-transmitting region functions as a phase shifter and is made of a fluorine-doped molybdenum silicide film formed by a sputtering technique that uses molybdenum metal as the target and $SiF_2$ as the reactive gas.

In a second aspect, the invention provides a phase shift mask comprising an exposure light-transmitting substrate and a second light-transmitting region on the substrate, which second light-transmitting region functions as a phase shifter and is made of a fluorine-doped molybdenum silicide film formed by a sputtering technique that uses molybdenum silicide as the target and $SiF_2$ as the reactive gas.

In a third aspect, the invention provides a phase shift mask comprising an exposure light-transmitting substrate and a second light-transmitting region on the substrate, which second light-transmitting region functions as a phase shifter and is made of a fluorine-doped chromium silicide film formed by a sputtering technique that uses chromium metal as the target and $SiF_2$ as the reactive gas.

In a fourth aspect, the invention provides a phase shift mask comprising an exposure light-transmitting substrate and a second light-transmitting region on the substrate, which second light-transmitting region functions as a phase shifter and is made of a fluorine-doped chromium silicide film formed by a sputtering technique that uses chromium silicide as the target and $SiF_2$ as the reactive gas.

In the phase shift mask of the above first, second, third or fourth aspect of the invention, the phase shifter is preferably made of a fluorine-doped molybdenum silicide film or a fluorine-doped chromium silicide film which changes the phase of exposure light passing through it 180±5 degrees and has a transmittance of 3 to 40%.

In a fifth aspect, the invention provides a method of manufacturing a phase shift mask, which method comprises the steps of forming a fluorine-doped molybdenum silicide film on an exposure light-transmitting substrate by sputtering, forming a resist pattern on the fluorine-doped molybdenum silicide film, and patterning the fluorine-doped molybdenum silicide film by dry etching or wet etching through the resist pattern.

In the phase shift mask manufacturing method according to the fifth aspect of the invention, sputtering is preferably carried out using molybdenum metal or molybdenum silicide as the target and using $SiF_2$ as a reactive gas.

In a sixth aspect, the invention provides a method of manufacturing a phase shift mask, which method comprises the steps of forming a fluorine-doped chromium silicide film on an exposure light-transmitting substrate by sputtering, forming a resist pattern on the fluorine-doped chromium silicide film, and patterning the fluorine-doped chromium silicide film by dry etching or wet etching through the resist pattern.

In the phase shift mask manufacturing method according to the sixth aspect of the invention, sputtering is preferably carried out using chromium metal or chromium silicide as the target and using $SiF_2$ as a reactive gas.

In the phase shift mask manufacturing method according to the fifth or sixth aspect of the invention, sputtering is typically reactive sputtering using a gas mixture of at least one element source gas selected from among oxygen, nitrogen and carbon with an inert gas and a reactive gas. Preferably, the element source gas is used at a flow rate such that the flow ratio of the element thus supplied relative to the inert gas is 1 to 40% for oxygen, 1 to 20% for nitrogen, and 1 to 10% for carbon.

In the manufacturing method according to the fifth or sixth aspect of the invention, the fluorine-doped molybdenum silicide film or fluorine-doped chromium silicide film is a phase shifter which changes the phase of exposure light passing through it 180±5 degrees and has a transmittance of 3 to 40%.

The fluorine-doped molybdenum silicide film and fluorine-doped chromium silicide film in the invention may also be formed using $SiF_4$ as the reactive gas instead of $SiF_2$. However, the use of $SiF_4$ as the reactive gas results in the generation of an excess of free fluorine atoms during decomposition of the gas within a plasma. Contrary to their intended function as a film-forming species, the excess free fluorine atoms behave as an etching gas, making it difficult to set appropriate film-forming conditions. That is, when $SiF_4$ is used as the reactive gas, some way must be found to favor the film-forming reaction over the directly competing etching reaction. By contrast, very few free fluorine atoms having an etching effect are generated when $SiF_2$ is used as the reactive gas. Thus, by introducing into the chamber as the reactive gas $SiF_2$ alone, which functions almost entirely as a film-forming species, efficient film formation can be achieved and the proportions of silicon and fluorine taken up by the film can be increased. The resulting film has greatly improved transmittance to short-wavelength light of 193 nm or less, and improved stability over time to short-wavelength, high-energy irradiation.

Moreover, the fluorine-doped molybdenum silicide film and the fluorine-doped chromium silicide film of the invention, by virtue of their high refractive indices, are capable of providing a 180-degree phase shift in transmitted light at a relatively small film thickness, thereby making it possible to minimize the effects (e.g., primarily focal depth) of shifter film thickness during light exposure.

BRIEF DESCRIPTION OF THE DRAWINGS

The objects, features and advantages of the invention will become more apparent from the following detailed description, taken in conjunction with the accompanying drawings.

FIG. 3 is a series of schematic sectional views illustrating the method of manufacturing phase shift masks according to the invention.

FIG. 5B is an enlarged view of region X in FIG. 5A.

DETAILED DESCRIPTION OF THE INVENTION

Figure 1:
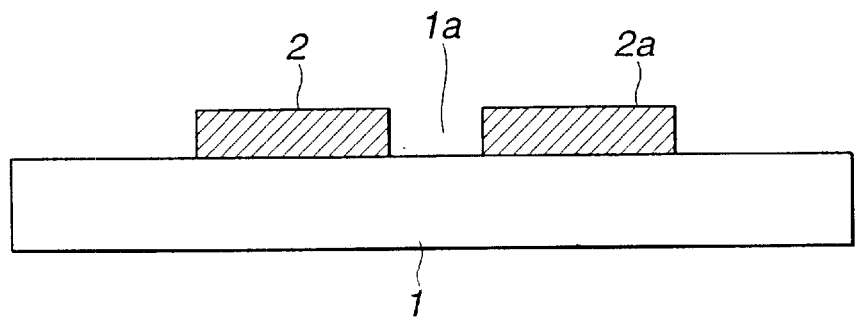
FIG. 1 is a sectional view of a phase shift mask according to one embodiment of the invention.

Referring to FIG. 1, the phase shift mask of the invention comprises a substrate 1 which is made of a material such as quartz or $CaF_2$ that is transparent to the exposure light, and a shifter film 2 that has been patterned on the substrate 1. The phase shift mask has first light-transmitting regions 1*a* between shifter film sections 2, and each shifter film section 2 forms a second light-transmitting region 2a. In the phase shift mask of the invention, the second light-transmitting regions 2a which serve as a shifter are made of a fluorine-doped molybdenum suicide film or a fluorine-doped chromium silicide film. Preferably, the film is formed to a thickness that gives a phase shift of 180±5 degrees and a transmittance of 3 to 40%.

The fluorine-doped molybdenum suicide film or fluorine-doped chromium silicide film on the phase-shift mask may be formed by a sputtering process which uses either molybdenum metal or molybdenum silicide as the target and $SiF_2$ as the reactive gas, or chromium metal or chromium silicide as the target and $SiF_2$ as the reactive gas.

A fluorine-doped molybdenum silicide film or a fluorine-doped chromium silicide film is employed as the phase shifter material in the inventive phase shift mask because it is possible to carry out a reactive sputtering process, involving the use of molybdenum, molybdenum silicide, chromium or chromium silicide as the target and the introduction of $SiF_2$ gas into the plasma, which can efficiently incorporate large amounts of silicon and fluorine into the film such as to form a phase shifter having a relatively high refractive index and the desired transmittance to 248 nm, 193 nm and 157 nm light.

The sputtering process used in the invention may be one which employs a direct-current power supply (d.c. sputtering) or a high-frequency power supply (r.f. sputtering). The use of magnetron sputtering or conventional sputtering is also possible.

The sputtering gas may be an inert gas such as argon or xenon in combination with $SiF_2$ as the reactive gas. However, it is preferable to carry out reactive sputtering using a gas mixture comprising any of various element source gases for supplying oxygen, nitrogen or carbon (e.g., carbon gas, nitrogen gas, methane gas, nitrogen monoxide gas, nitrogen dioxide gas) in combination with an inert gas such as argon and a reactive gas ($SiF_2$).

The reason for carrying out reactive sputtering while passing a stream of gas mixture through the sputtering chamber is to alter the refractive index and transmittance of the fluorine-doped molybdenum silicide film or fluorine-doped chromium silicide film being formed so as to achieve optimal film properties for a phase shifter material.

Moreover, compared with film formation by reactive sputtering in which a large flow rate of element source gas such as oxygen, nitrogen or methane is passed through from a $MoSi_x$ (where x is 2 to 3) target, as in the case of prior-art molybdenum silicide halftone masks, the proportion of element source gas can be decreased in the present invention, thereby minimizing the chance of particle formation, since the element source gas can be used only for slightly adjusting the light transmittance or refractive index of the phase shift mask.

The $SiF_2$ used as the reactive gas in the present invention is commonly known as difluorosilylene. Silylenes are generally highly unstable active species which exist only as reaction intermediates, similar to the carbon analogues, which are unstable intermediates known as carbenes. However, difluorosilylene ($SiF_2$) has a half-life of about 150 seconds, and so it can exist for a sufficient length of time to serve as a reactive gas.

$SiF_2$ gas can be produced by heating a piece of silicon to a temperature of 1150 to 1250° C. and passing $SiF_4$ gas over the silicon. The $SiF_2$ gas thus produced is introduced into a vacuum sputtering system. The $SiF_2$ (difluorosilylene) active species that has just formed can be used within the sputtering system as the reactive gas. For a more complete description of the process, reference may be made to *Journal of Material Chemistry*, Vol. 6, No. 7, 1131–1133 (1996).

Figure 2:
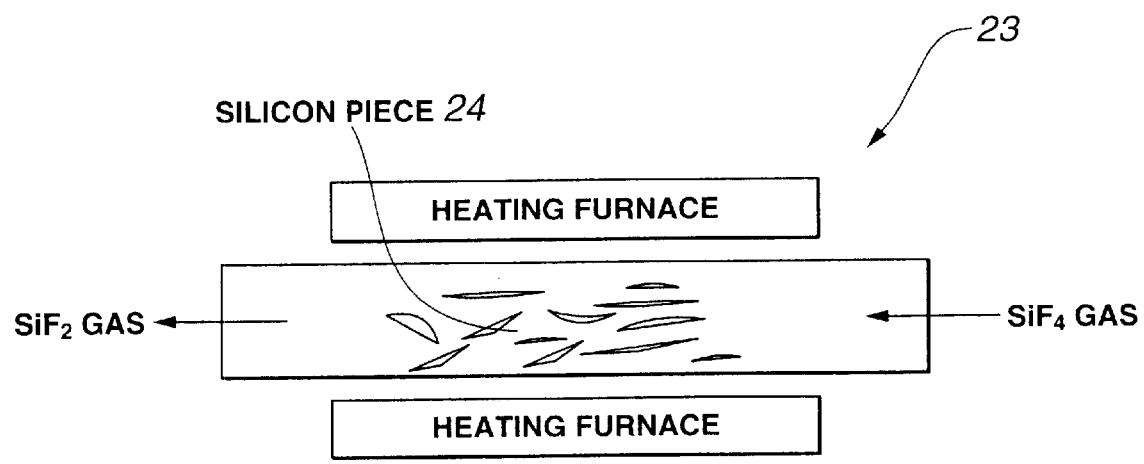
FIG. 2 is a schematic of a $SiF_2$ gas generator such as may be used in manufacturing the phase shift masks according to the invention.

Specifically, as shown in FIG. 2, the $SiF_2$ gas can be formed by placing pieces of silicon 24 in a $SiF_2$ gas generator 23, heating to a temperature of 1100 to 1300° C., and passing $SiF_4$ gas over the silicon pieces. The flow rate of $SiF_2$ gas from the generator 23 may be determined based on an assumption of 50% conversion to $SiF_2$ gas. Although the flow rate of $SiF_2$ gas varies empirically with such factors as the type of generator used and the power applied, it is advantageous for the flow rate of inert gas relative to the flow rate of $SiF_2$ gas to be within a range of about 1:0.05 to about 1:20.

To fine-tune the light transmittance or refractive index of the fluorine-doped molybdenum silicide film or fluorine-doped chromium silicide film, the gas mixture used in reactive sputtering may be one prepared by mixing an oxygen, nitrogen or carbon element source (e.g., oxygen, nitrogen, methane, nitrous oxide, carbon monoxide, carbon dioxide) into the inert gas (e.g., argon) and the reactive gas ($SiF_2$). It is possible, in particular, to make selective use of such element source gases according to the intended application. For example, the film properties can be adjusted by introducing oxygen or nitrogen gas when greater transmittance is required, or by introducing a carbon component if the transmittance needs to be lowered.

Varying the proportion of the element source gas enables the refractive index to be varied over a broad range of about 1.8 to about 2.5. By varying the refractive index in this way, the phase shift angle can be changed even at the same film thickness, thus allowing subtle adjustments to be made in the amount of phase shift.

The element source gas can be used at a flow rate such that the ratio of the element thus supplied relative to the inert gas is 1 to 40% for oxygen, 1 to 20% for nitrogen, and 1 to 10% for carbon. The use in reactive sputtering of a relatively small amount of source element gas is capable of changing the refractive index of the shifter film.

Film formation is carried out by adjusting the thickness of the shifter film to the thickness D, defined as $$D = \lambda/2(n-1) \tag{1}$$

wherein D is the shifter film thickness for generating a 180-degree phase shift, n is the refractive index of the shifter material, and $\lambda$ is the wavelength of the transmitted light.

In the case of fluorine-doped molybdenum silicide film and fluorine-doped chromium silicide film, the refractive index is about 1.8 to about 2.5, and the target film thickness varies according to the wavelength $\lambda$ of the light source used. Table 1 shows the target film thickness for achieving a phase shift of 180 degrees in exposure light from various light sources.

TABLE 1

Film thickness of shifter material at which a phase shift of 180° is achieved for various light sources (refractive index n = 2.3)

| | Wavelength ($\lambda$) | Target film thickness |
|---|---|---|
| KrF | 248 nm | 953 Å |
| ArF | 193 nm | 742 Å |
| $F_2$ | 157 nm | 604 Å |

However, because the refractive index decreases at shorter wavelengths, the film thickness must generally be made thicker than indicated in the table. Moreover, if there is an in-plane distribution in the actual film thickness on the substrate, the film thickness will vary somewhat from the indicated value. Hence, it is desirable to apply the film uniformly to the target thickness at the time of film formation, and to minimize variations in the quality and thickness of the applied film so that the phase shift mask provides a phase shift within what is generally the allowable range of 180±5 degrees.

Also, given that the shifter film on the phase shift mask must have a light transmittance which does not exceed the exposure threshold of the resist (about 5%), it is preferable for the shifter film to be prepared as a material having a transmittance of about 5% at the respective wavelengths. The transmittance can be suitably adjusted by using within the gas mixture during sputtering the above-described gases which serve as sources of elements such as oxygen, nitrogen and carbon. That is, if the transmittance at the respective wavelengths is inadequate, the proportion of primarily oxygen and nitrogen components may be increased so as to increase the level of oxygen and nitrogen components incorporated into the sputtered film. On the other hand, if the transmittance at various wavelengths is too high, the amount of carbon gas components such as methane can be increased to raise the level of carbon component incorporated into the film.

A transmittance of about 5% is generally suitable, although in most cases effective use as a phase shifter material is possible at a transmittance within a range of about 3 to about 40%, provided the exposure threshold for the resist is not exceeded.

Figure 3A:
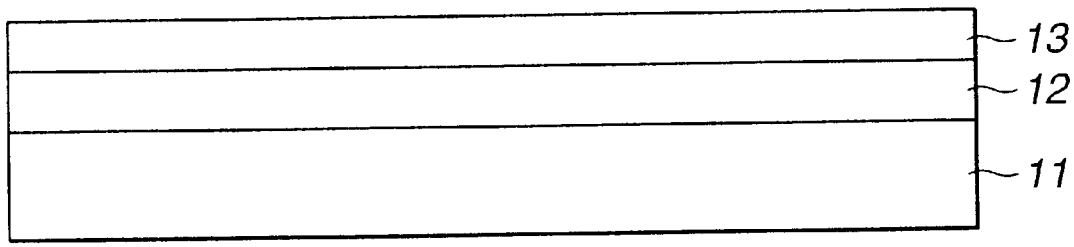
FIG. 3A shows the mask blank on which a resist film has been formed.
Figure 3B:
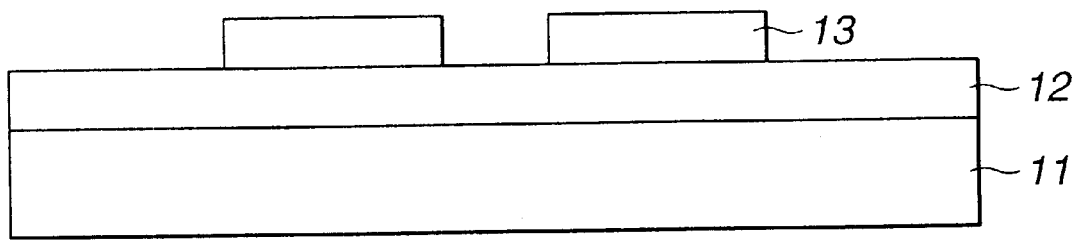
FIG. 3B shows the mask structure after the resist film has been patterned.
Figure 3C:
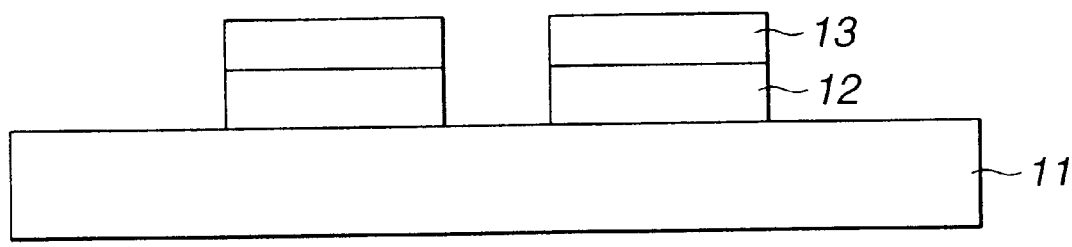
FIG. 3C shows the structure after dry or wet etching.
Figure 3D:
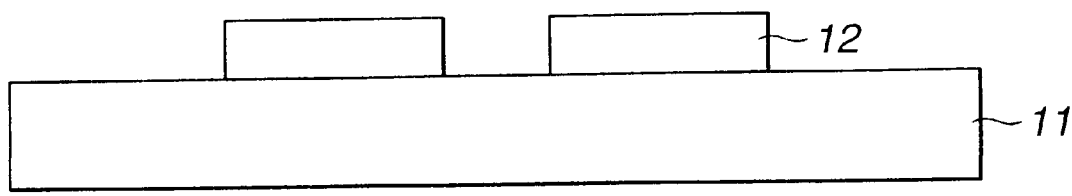
FIG. 3D shows the completed mask after the resist film has been removed.

Referring to FIG. 3, manufacture of the phase shift mask of the invention may be carried out by a process in which a fluorine-doped molybdenum silicide film or fluorine-doped chromium silicide film 12 is formed on a substrate 11, and a resist film 13 is subsequently formed on the metal silicide film 12 (FIG. 3A). Next, the resist film 13 is patterned (FIG. 3B), after which the fluorine-doped molybdenum silicide film or fluorine-doped chromium silicide film 12 is dry etched or wet etched (FIG. 3C). The resist film 13 is subsequently stripped (FIG. 3D). In this process, application of the resist film, patterning (exposure and development), dry or wet etching, and removal of the resist film may be carried out by known techniques.

The phase shift film in the invention need not necessarily be composed of only a single layer. It is also possible for the phase shift mask to have a multilayer construction comprising a light-shielding film formed on a fluorine-doped molybdenum silicide film or a fluorine-doped chromium silicide film.

EXAMPLES

The following examples are provided by way of illustration, and are not intended to limit the scope of the invention.

Example 1

Figure 4:
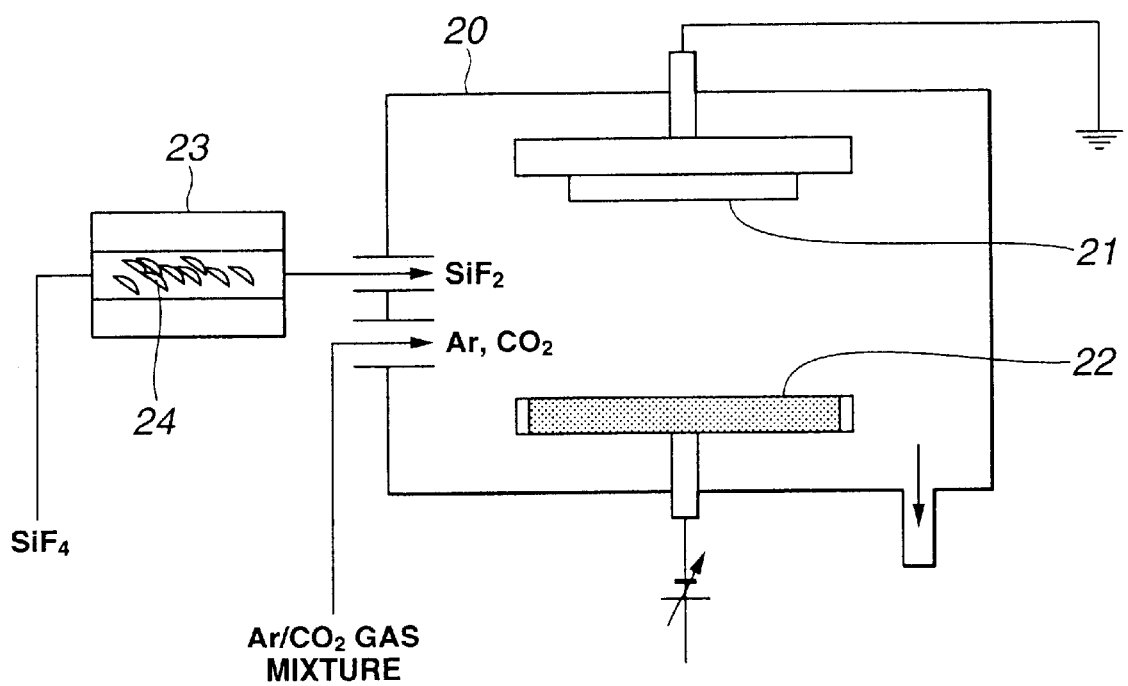
FIG. 4 is a schematic illustration of the sputtering system used in the examples.
Figure 5A:
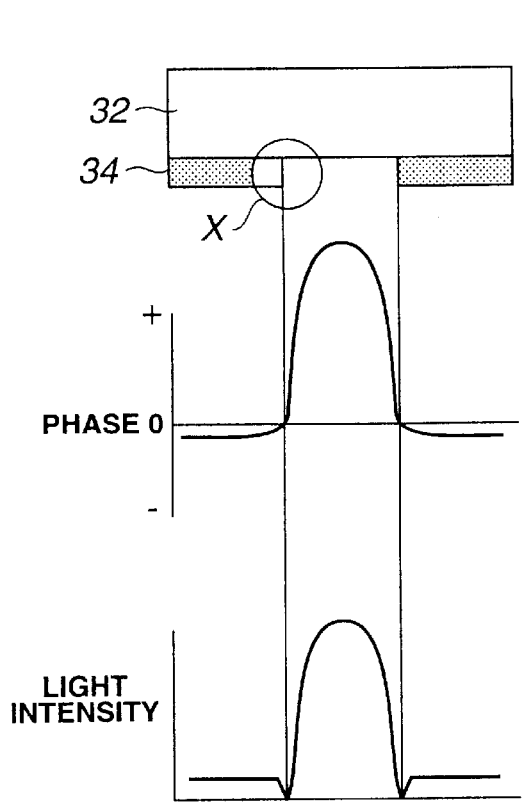
FIGS. 5A and 5B illustrate the operating principle of a halftone phase shift mask.
Figure 5B:
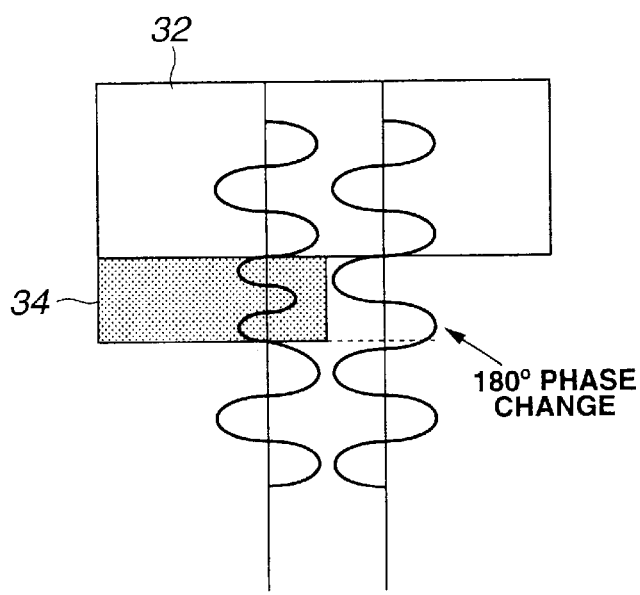

A fluorine-doped molybdenum silicide film was formed on a quartz substrate in the sputtering system shown in FIG. 4. The system had a vacuum chamber 20 containing a quartz substrate 21 and a target 22. Molybdenum was used as the target. There were used argon as the inert gas at a flow rate of 30 sccm, difluorosilylene ($SiF_4$) as the reactive gas at a flow rate of 10 sccm, and $CO_2$ as the element source gas for supplying oxygen and carbon at a flow rate of 10 sccm.

The $SiF_2$ gas was formed by placing pieces of silicon 24 in a $SiF_2$ gas generator, heating the silicon to 1200° C., and passing $SiF_4$ gas over it at a flow rate of 20 sccm. Assuming a 50% conversion of $SiF_4$ gas to $SiF_2$ gas, the flow rate of $SiF_2$ gas was set at 10 sccm.

Reactive sputtering was carried out while passing the mixed sputtering gases through the chamber from a sidewall thereof, in the manner shown in FIG. 4.

The sputtering conditions are shown in Table 2. The properties (thickness, refractive index, transmittance) of the resulting film were measured with a GESP-5 spectroscopic ellipsometry system manufactured by SOPRA. The results are presented in Table 3. In Table 2 and below, the target-to-substrate distance is abbreviated as "TS distance."

TABLE 2

| | Gas mixture composition (sccm) | | | Power density | Subst-rate temperature | Sputtering pressure | TS distance | Target |
|---|---|---|---|---|---|---|---|---|
| | Ar | $SiF_2$ | $CO_2$ | | | | | |
| Example 1 | 30 | 10 | 10 | 10 W/cm$^2$ | 150° C. | 0.6 Pa | 70 mm | Mo |

TABLE 3

| | Film thickness | Refractive index | | Transmittance | |
|---|---|---|---|---|---|
| | | 248 nm | 193 nm | 248 nm | 193 nm |
| Example 1 | 1280 Å | 1.86 | 1.93 | 8.8% | 3.5% |

Examples 2 to 4

Phase shifting films were formed in the same way as in Example 1, but under the respective sputtering conditions shown in Table 4. The properties (thickness, refractive index, transmittance) of the resulting films were measured with a GESP-5 spectroscopic ellipsometry system manufactured by SOPRA. The results are presented in Table 5.

TABLE 4

| | Gas mixture composition (sccm) | | | | Power density (W/cm²) | Substrate temperature (° C.) | Sputtering pressure (Pa) | TS distance (mm) | Target |
| --- | --- | --- | --- | --- | --- | --- | --- | --- | --- |
| | Ar | SiF₂ | CO₂ | N₂ | | | | | |
| Example 2 | 30 | 5 | 3 | 2 | 10 | 140 | 0.8 | 70 | MoSi |
| Example 3 | 30 | 10 | 8 | 1 | 15 | 150 | 0.7 | 70 | Cr |
| Example 4 | 30 | 3 | 5 | 3 | 8 | 150 | 0.7 | 70 | CrSi |

TABLE 5

| | Film thickness | Refractive index | | Transmittance | |
| --- | --- | --- | --- | --- | --- |
| | | 248 nm | 193 nm | 248 nm | 193 nm |
| Example 2 | 1120 Å | 1.98 | 2.12 | 13% | 6% |
| Example 3 | 1354 Å | 2.12 | 2.24 | 3.7% | 1.2% |
| Example 4 | 1267 Å | 1.86 | 2.08 | 11% | 4.8% |

As is apparent from the results obtained in the above examples, the present invention provides phase shifter materials which have good light transmittance and stability over time, and are able to endure even short-wavelength, high-energy irradiation such as ArF excimer laser light or $F_2$ laser light.

Moreover, the invention provides phase shift masks, and methods for their manufacture, in which the use of a shifter material having a relatively high refractive index to short-wavelength exposure light of a wavelength of 193 nm or less for minimizing the topography of the master pattern surface at which the exposure light is focused enables a 180-degree phase change to be achieved and thus allows the mask to have an improved profile shape at the time of exposure.

The present invention is thus able to resolve the problems inherent in prior-art halftone phase shift masks, making it possible to fabricate semiconductor integrated circuits to a smaller minimum feature size and a higher level of integration.

Japanese Patent Application No. 2000-047373 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A phase shift mask comprising an exposure light-transmitting substrate and a second light-transmitting region on the substrate, which second light-transmitting region functions as a phase shifter and is made of a fluorine-doped molybdenum silicide film formed by a sputtering technique that uses molybdenum metal as the sputtering target and $SiF_2$ as the reactive gas.

2. The phase shift mask according to claim 1, wherein the phase shifter made of a fluorine-doped molybdenum silicide film or a fluorine-doped chromium silicide film changes the phase of exposure light passing through it 180±5 degrees and has a transmittance of 3 to 40%.

3. A phase shift mask comprising an exposure light-transmitting substrate and a second light-transmitting region on the substrate, which second light-transmitting region functions as a phase shifter and is made of a fluorine-doped molybdenum silicide film formed by a sputtering technique that used molybdenum silicide as the sputtering target and $SiF_2$ as the reactive gas.

4. A phase shift mask comprising an exposure light-transmitting substrate and a second light-transmitting region on the substrate, which second light-transmitting region functions as a phase shifter and is made of a fluorine-doped chromium silicide film formed by a sputtering technique that uses chromium metal as the sputtering target and $SiF_2$ as the reacitve gas.

5. A phase shift mask comprising an exposure light-transmitting substrate and a second light-transmitting region on the substrate, which second light-transmitting region functions as a phase shifter and is made of a fluorine-doped choromium silicone film formed by a sputtering technique that uses chromium silicide as the sputtering target and $SiF_2$ as the reactive gas.

6. A method of manufacturing a phase shift mask, the method comprising the steps of:
   forming a fluorine-doped molybdenum silicide film on an exposure light-transmitting substrate by sputtering,
   forming a resist pattern on the fluorine-doped molybdenum silicide film, and
   patterning the fluorine-doped molybdenum silicide film by dry etching or wet etching through the resist pattern.

7. The method of manufacturing a phase shift mask according to claim 6, wherein sputtering is carried out using molybdenum metal or molybdenum silicide as the target and $SiF_2$ as a reactive gas.

8. The method of claim 6, wherein sputtering is reactive sputtering using a gas mixture of at least one element source gas supplying oxygen, nitrogen and/or carbon with an inert gas and a reactive gas.

9. The manufacturing method of claim 8, wherein the element source gas is used at a flow rate such that the flow ration of the element thus supplied relative to the inert gas is 1 to 40% for oxygen, 1 to 20% for nitrogen, and 1 to 10% for carbon.

10. The manufacturing method of claim 6, wherein the fluorine-doped molybdenum silicide film or fluorine-doped chromium silicide film is a phase shifter which changes the phas of exposure light passing through it 180±5 degrees and has a transmittance of 3 to 40%.

11. A method of manufacturing a phase shift mask, the method comprising the steps of:
   forming a fluorine-doped chromium silicide film on an exposure light-transmitting substrate by sputtering,
   forming a resist pattern on the fluorine-doped chromium silicide film, and
   patterning the fluorine-doped chromium silicide film by dry etching or wet etching through the resist pattern.

12. The method of manufacturing a phase shift mask according to claim 11, wherein sputtering is carried out using chromium metal or chromium silicide as the target and $SiF_2$ as a reactive gas.

13. The phase shift mask according to claim 3, wherein the phase shifter made of a fluoring-doped molybdenum silicide film or a fluorine-doped chromium silicide film changes the phase of exposure light passing through it 180±5 degrees and has a transmittance of 3 to 40%.

14. The phase shift mask according to claim 4, wherein the phase shifter made of a fluorine-doped molybdenum silicide film or a fluorine-doped chromium silicide film changes the phase of exposure light passing through it 180±5 degrees and has a transmittance of 3 to 40%.

15. The phase shift mask according to claim 5, wherein the phase shifter made of a fluorine-doped molybdenum silicide film or a fluorine-doped chromium silicide film changes the phase of exposure light passing through it 180±5 degrees and has a transmittance of 3 to 40%.

16. The method of claim 11, wherein sputtering is reactive sputtering using a gas mixture of at least one element source gas supplying oxygen, nitrogen and/or carbon with an inert gas and a reactive gas.

17. The manufacturing method of claim 16, wherein the element source gas is used at a flow rate such that the flow ratio of the element thus supplied relative to the inert gas is 1 to 40% for oxygen, 1 to 20% for nitrogen, and 1 to 10% for carbon.

18. The manufacturing method of claim 11, wherein the fluorine-doped molybdenum silicide film or fluorine-doped chromium silicide film is a phase shifter which changes the phase of exposure light passing through it 180±5 degrees and has a transmittance of 3 to 40%.

19. The method of claim 8, wherein the element source gas is carbon gas, nitrogen gas, methane gas, nitrogen monoxide gas, nitrogen dioxide gas, or a mixture thereof, and wherein the inert gas is argon or xenon, and wherein the reactive gas is $SiF_2$.

20. The method of claim 16, wherein the element source gas is carbon gas, nitrogen gas, methane gas, nitrogen monoxide gas, nitrogen dioxide gas, or a mixture thereof, and wherein the inert gas is argon or xenon, and wherein the reactive gas is $SiF_2$.

* * * * *